(12) United States Patent
Peffers et al.

(10) Patent No.: US 11,108,406 B2
(45) Date of Patent: Aug. 31, 2021

(54) SYSTEM, APPARATUS AND METHOD FOR DYNAMIC PRIORITY-AWARE COMPRESSION FOR INTERCONNECT FABRICS

(71) Applicant: Intel Corporation, Santa Clara, CA (US)

(72) Inventors: Simon N. Peffers, Acton, MA (US); Vinodh Gopal, Westborough, MA (US); Kirk Yap, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/445,556

(22) Filed: Jun. 19, 2019

(65) Prior Publication Data

US 2019/0305797 A1 Oct. 3, 2019

(51) Int. Cl.
| | | |
|---|---|---|
| *H03M 7/38* | (2006.01) | |
| *H03M 7/30* | (2006.01) | |
| *G06F 12/0875* | (2016.01) | |
| *G06F 12/0888* | (2016.01) | |
| *G06F 9/54* | (2006.01) | |

(52) U.S. Cl.
CPC ...... *H03M 7/6029* (2013.01); *G06F 12/0875* (2013.01); *G06F 12/0888* (2013.01); *G06F 9/544* (2013.01)

(58) Field of Classification Search
CPC .... H03M 7/30; H03M 7/3088; H03M 7/4006; H03M 7/3086; H03M 7/40; H03M 7/3084; H03M 7/3059; H03M 7/6082; H03M 7/6064; H03M 7/6023; H03M 7/607; H03M 7/6041

USPC .................................................. 341/51, 107
See application file for complete search history.

(56) References Cited

U.S. PATENT DOCUMENTS

| | | | | | |
|---|---|---|---|---|---|
| 5,659,635 | A | * | 8/1997 | Komatsu | G06T 9/005 341/51 |
| 6,055,502 | A | * | 4/2000 | Kitamura | G10H 1/125 704/500 |
| 6,606,328 | B1 | * | 8/2003 | Susnow | H03M 5/145 341/58 |
| 7,593,433 | B1 | * | 9/2009 | Wu | H04J 14/0227 370/537 |
| 8,947,270 | B2 | | 2/2015 | Gopal et al. | |
| 9,059,729 | B1 | * | 6/2015 | Wu | H03M 7/6064 |
| 9,419,647 | B2 | | 8/2016 | Gopal et al. | |
| 9,473,168 | B1 | * | 10/2016 | Gopal | H03M 7/3082 |

(Continued)

OTHER PUBLICATIONS

U.S. Appl. No. 16/369,220, filed Mar. 29, 2019, entitled "System, Apparatus and Method for Increasing Bandwidth of Edge-Located Agents of an Integrated Circuit," by Brinda Ganesh, et al.

(Continued)

*Primary Examiner* — Linh V Nguyen
(74) *Attorney, Agent, or Firm* — Trop Pruer & Hu, P.C.

(57) ABSTRACT

In one embodiment, an apparatus includes: a compression circuit to compress data blocks of one or more traffic classes; and a control circuit coupled to the compression circuit, where the control circuit is to enable the compression circuit to concurrently compress data blocks of a first traffic class and not to compress data blocks of a second traffic class. Other embodiments are described and claimed.

20 Claims, 10 Drawing Sheets

(56) References Cited

U.S. PATENT DOCUMENTS

| | | | |
|---|---|---|---|
| 9,524,169 B2 | 12/2016 | Gopal et al. | |
| 2012/0022861 A1* | 1/2012 | Imthurn | H04N 19/91 |
| | | | 704/229 |
| 2012/0182163 A1* | 7/2012 | Cho | H03M 7/30 |
| | | | 341/87 |
| 2013/0007346 A1* | 1/2013 | Khan | H03M 7/30 |
| | | | 711/103 |
| 2014/0006536 A1 | 1/2014 | Guilford et al. | |
| 2014/0223030 A1* | 8/2014 | Bhaskar | H04L 69/04 |
| | | | 709/247 |
| 2015/0371417 A1* | 12/2015 | Angelov | G06F 3/0354 |
| | | | 345/442 |
| 2017/0012641 A1* | 1/2017 | Lee | H03M 7/30 |
| 2017/0250708 A1* | 8/2017 | Blaettler | G06F 3/0608 |
| 2018/0213231 A1* | 7/2018 | Park | H04N 19/13 |
| 2019/0087979 A1* | 3/2019 | Mammou | H04N 19/597 |
| 2019/0123763 A1* | 4/2019 | Bissessur | H03M 7/3084 |
| 2019/0227765 A1* | 7/2019 | Soifer | G06F 3/162 |

OTHER PUBLICATIONS

U.S. Appl. No. 16/353,091, filed Mar. 14, 2019, entitled "System, Apparatus and Method for Low Overhead Communication Encoding," by Steffen Reinhardt.

* cited by examiner

SYSTEM, APPARATUS AND METHOD FOR DYNAMIC PRIORITY-AWARE COMPRESSION FOR INTERCONNECT FABRICS

TECHNICAL FIELD

Embodiments relate to compression techniques for use in interconnects.

BACKGROUND

A variety of different compression techniques are known and used to compress data in computer systems, e.g., to reduce storage requirements. In addition, some networks compress data prior to communication on the network and decompress the compressed data at a receiver. While such techniques can work well, a given system is typically fixed to either enable compression or not, and this fixed arrangement may not be suitable for certain traffic.

DETAILED DESCRIPTION

In various embodiments, circuitry and techniques are provided to control compression of data packets that are transmitted over communication links or interconnect fabrics (e.g., an on-chip fabric or mesh that connects cores and various agents in a system on chip (SoC) or other integrated circuit). With embodiments, dynamic determinations may be made as to whether to compress data communicated on a link/fabric. Such compression may, for example, increase bandwidth, reduce power consumption, reduce loaded latency, and increase performance. While embodiments herein are described in the context of on-chip communications, understand the scope of the present invention is not so limited and embodiments apply equally to off-chip links such as inter-socket links, board interconnects and so forth.

More specifically, in embodiments, dynamic compression enabling is provided. This is so, since compression generally incurs a latency penalty when a fabric is lightly loaded, as it takes some amount of time for traffic to be processed by a compression engine. To avoid adding latency when a system is not substantially loaded, embodiments may cause compression to be disabled or bypassed until the system becomes loaded. At that time, compression is enabled until the system again becomes lightly loaded, at which time compression is disabled.

Also in embodiments, the determination as to whether to compress may be based on type information regarding data, such as traffic class and/or priority. That is, data traffic can often be divided into two or more classes associated with different priorities, where higher priority traffic is more timing or latency sensitive, while lower priority traffic is less sensitive. In this case embodiments may enable compression earlier for lower priority traffic and only in the most loaded situation enable compression for high priority traffic, to avoid adding unnecessary latency. Embodiments further may be configured to allow high priority traffic to bypass low priority traffic, for example, to improve performance. Still further, embodiments may implement compression operations in a manner that maintains traffic order awareness, including maintaining traffic ordering rules. For example there may be a sequence of related traffic that is to be sent in order over the fabric. Embodiments thus provide techniques for priority-aware compression circuitry that supports an arbitrary number of classes/priorities, dynamic compression enabling per traffic class, and traffic order awareness.

Figure 1:
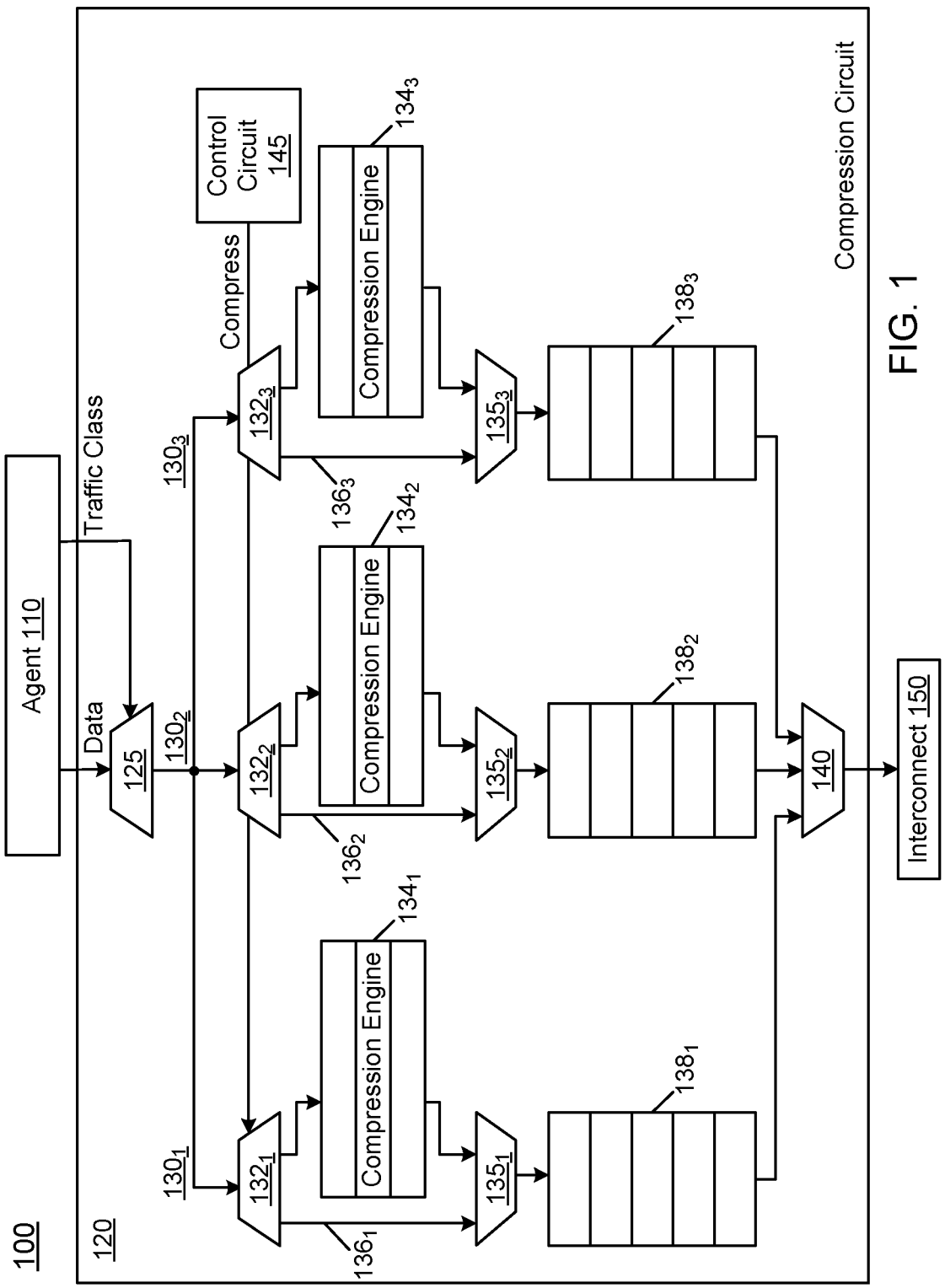
FIG. 1 is a block diagram of a compression circuit in accordance with an embodiment of the present invention.

Referring to FIG. 1, shown is a block diagram of a compression circuit in accordance with an embodiment of the present invention. More specifically, in FIG. 1, apparatus 100, which may be part of an integrated circuit such as a system on chip, network on chip or other multicore processor, may include a plurality of computing engines. These computing engines may include one or more homogeneous or heterogeneous cores, graphics processors and/or specialized processing units. For ease of discussion herein, understand that the term "agent" is used to refer to any type of processing unit, including cores, graphics processors, specialized processors and so forth.

To effect dynamic and independently controllable compression operations for information of different traffic classes, embodiments provide a compression circuit 120 coupled between an agent 110 and an interconnect 150, such as an on-die fabric, mesh interconnect or so forth. Agent 110 sends and receives traffic over fabric 150, and fabric 150 routes and transmits traffic between agents. Understand that while embodiments herein are with regard to on-chip interconnects, the scope of the present invention is not limited in this regard and the dynamic compression techniques described herein may apply equally to off-chip interconnects such as an Intel® Ultra Path Interconnect or other interconnect that couples together multiple processor sockets.

In the embodiment of FIG. 1, compression circuit 120 may be implemented as a dedicated circuit located between agent 110 and interconnect 150. In a particular embodiment, compression circuit 120 may be included in a so-called mesh stop, which provides a fabric interface to interconnect 150. Of course in other embodiments, the circuitry shown in FIG. 1 may be present in other locations, including in interface circuitry of agent 110, interconnect 150 or so forth. In one embodiment, compression circuit 120 may be implemented in compression shim circuitry and decompression shim circuitry. The focus herein is on the compression shim circuitry. In general, a decompression shim circuit is configured to receive traffic from the fabric, decompress it if necessary, and deliver it to the agent.

As illustrated, incoming information, e.g., terms of data packets may be output by agent 110. As an example, agent 110 may be configured to output data packets of a cache line width (e.g., 64 bytes). In a particular example, incoming data packets may be 64 bytes wide. However, physical interconnect links can be 32 bytes wide such that if uncompressed, the data packet is sent as two data chunks, each of 32 byte widths. In embodiments herein, to provide an indication of priority of a given packet, agent 110 further may provide a traffic class identifier for each data packet. As seen, incoming data packets and the traffic class identifiers are provided to a distribution circuit 125, which may include, e.g., a demultiplexer to direct a given data packet to one of multiple pipelines 130$_1$-130$_3$ based on traffic class. Thus in this example, assume the presence of three different traffic classes, each corresponding to a given priority (e.g. low, mid and high priority). Of course embodiments are not limited in this regard and in other cases more or fewer pipelines and traffic classes may be present.

With reference to exemplary pipeline 130$_1$, an incoming data packet is received in a first selection circuit 132$_1$. First selection circuit 132$_1$ may, in response to a compression enable signal received from a control circuit 145, be configured to direct an incoming data packet to a bypass path 136$_1$ or a compression engine 134$_1$ for compression. As will be described herein, control circuit 145 may determine whether to enable (or disable) compression for a given traffic class based on a number of factors, including interconnect loading, priority of the traffic class, busyness of the traffic class and so forth. Each pipeline 130 may be associated with an independent compression enable signal generated by control circuit 145. If compression is enabled, traffic is directed to compression engine 134$_1$, otherwise it bypasses compression engine 134$_1$ via bypass path 136$_1$. In embodiments, this compression enable signal per traffic class may be determined based on one or more of congestion level in the system, programmable thresholds, or other triggers. Note that if traffic order is to be maintained, compression is not disabled for a given traffic class until compression engine 134 for that traffic class is drained.

In the high level view of FIG. 1, note that control circuit 145 may receive incoming traffic level information, such as in the form of a distress or congestion signal (or signals) to indicate at least one point of congestion within the interconnect system. For example, in some cases every mesh agent may be configured to raise a distress signal when its bandwidth is limited. In other cases, this traffic information may include actual bandwidth information and/or traffic levels, which control circuit 145 may use in determining whether to enable compression for one or more traffic classes.

Compression engine 134$_1$ may be configured to compress incoming data packets according to at least one compression technique. Understand that in different embodiments, depending on a desired compression factor, power consumption, latency and so forth, different compression techniques may be used. Although the scope of the present invention is not limited in this regard in one embodiment a pattern matching compression technique such as a frequent-pattern-compression (FPC) technique may be used. In other embodiments, compression may be performed using Wilson-Kaplan (WKDM), base-delta-immediate (BDI) or bit-plane-compression (BPC) techniques. In some cases, compression engine 134$_1$ may perform compression of an incoming data packet with a multi-cycle latency. Compression engine 134$_1$ may include an internal buffer structure such as a first-in first-out (FIFO) buffer such that some number of data packets may be present within compression engine 134$_1$ at any given time.

Still referring to FIG. 1, instead if compression is not enabled for this first traffic class, incoming data packets are provided through first selection circuit 132$_1$ via a bypass path 136$_1$ to a second selection circuit 135$_1$. In embodiments, second selection circuit 135$_1$ may be implemented as a multiplexer, and may be controlled based on the compression enable signal to select for output compressed data packets from compression engine 134$_1$ when compression is enabled, otherwise to select data packets received via bypass path 136$_1$ when compression is not enabled. As such, second selection circuit 135$_1$ is configured to pass a packet from a given path into an egress queue 138$_1$ which, in an embodiment, may be implemented as a FIFO buffer. In one example embodiment, egress buffer 138$_1$ may have a depth of between approximately 8 and 16 entries. In general, the buffer depth may be based on latency and throughput requirements and capabilities of the interconnects. Understand while the above discussion relates to pipeline 130$_1$, the same components and operation adhere for second and third pipelines 130$_2$ and 130$_3$.

Still with reference to FIG. 1, the output of each egress queue 138 is coupled to an arbitration circuit 140 (also referred to as "arbiter"). Arbiter 140 is configured to select, each cycle, a packet from one of queues 138 for output onto interconnect 150 as slots are available. In different embodiments, various parameters may be considered by arbiter 140 to select a packet of a given queue for output. As examples, arbiter 140 may consider one or more of the following: age of egress queue entries; egress queue occupancy; traffic class and/or traffic priority; basic schemes such as round robin; and/or other parameters to ensure liveness or anti-deadlock. Although shown at this high level in the embodiment of FIG. 1, many variations and alternatives are possible.

Figure 2:
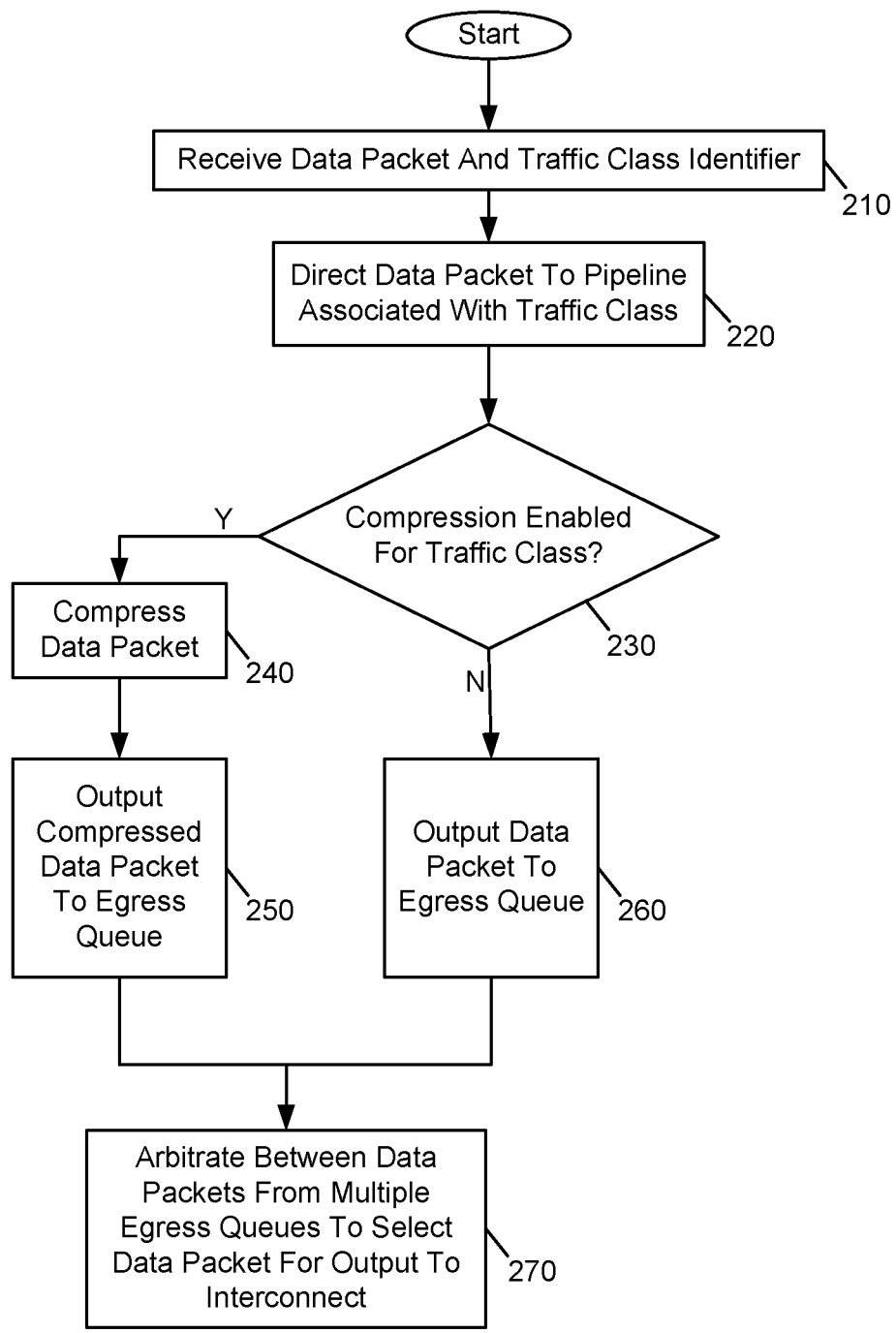
FIG. 2 is a flow diagram of a method in accordance with an embodiment of the present invention.

Referring now to FIG. 2, shown is a flow diagram of a method in accordance with an embodiment of the present invention. More specifically, method 200 is a method for operating a compression circuit having multiple parallel pipelines such as present in FIG. 1. As such, method 200 may be performed by hardware circuitry, firmware, software and/or combinations thereof. In a particular embodiment, method 200 may be performed within compression circuit 120.

As seen, method 200 begins by receiving a data packet and a traffic class identifier from an agent coupled to the compression circuit (block 210). Next at block 220 the data packet is directed to a pipeline associated with the particular traffic class. Next it is determined whether compression is enabled for this traffic class (diamond 230). In an embodiment, a selection circuit of the pipeline may receive a compression enable signal on which this determination is based. If it is determined that compression is enabled (e.g. due to network loading, low priority of this traffic class, busyness of this traffic class or so forth), control passes to block 240 where the data packet is compressed. More specifically, the selection circuit may direct this data packet to the compression engine of the pipeline. After compression, the compression engine outputs the compressed data packet to the egress queue (block 250). Note that the compressed data packet may flow through another selection circuit on its path to the egress queue. Note also that it is possible that even in instances where compression is enabled, one or more data packets may not be compressed when the compression engine determines that compression is not possible for some reason (e.g., due to a distribution of logic ones and zeros within a packet or otherwise).

Still referring to FIG. 2, instead if it is determined at diamond 230 that compression is not enabled for this traffic class, control passes to block 260 where the data packet is sent directly to the egress queue. As such, this data packet may traverse on a bypass path coupled between the first selection circuit and the second selection circuit, and then into the egress queue.

Note that the operations discussed above (namely from blocks 220 and onward to this point) may be performed individually in each pipeline of the compression circuit. Once packets are directed into the egress queue of the corresponding pipeline, control next passes to block 270 where an arbitration may be performed between the data packets from the egress queues (namely the oldest packet in each queue). Based on this arbitration, an arbiter may select a data packet for output onto the interconnect. Note that this packet may be compressed or not, depending upon which pipeline it was received from and whether that pipeline was enabled for compression or not. Understand while shown at this high level in the embodiment of FIG. 2, many variations and alternatives are possible.

As discussed above, the determination as to whether compression is to be enabled for a given traffic class may be made by a control circuit based on a variety of different inputs. In a particular embodiment, such inputs may include traffic level information such as in the form of a distress signal or other information regarding loading on the interconnect, priority information regarding priority of the different traffic classes, and buffer depth information that acts as a measure of the busyness of the different traffic classes.

Figure 3:
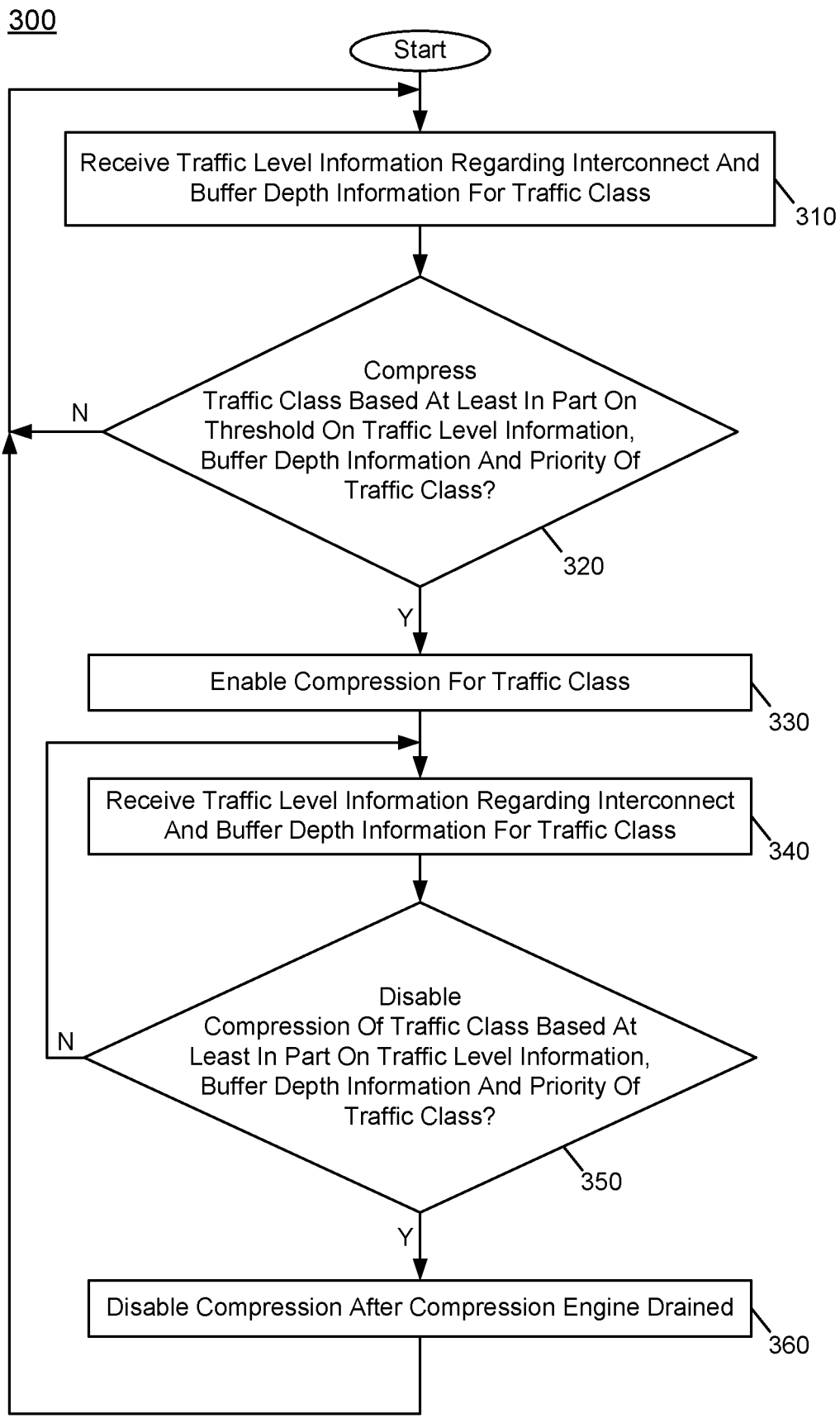
FIG. 3 is a flow diagram of a method in accordance with another embodiment of the present invention.

Referring now to FIG. 3, shown is a flow diagram of a method in accordance with another embodiment of the present invention. More specifically, method 300 is a method for controlling a compression circuit having multiple parallel pipelines such as present in FIG. 1. As such, method 300 may be performed by hardware circuitry, firmware, software and/or combinations thereof. In a particular embodiment, method 300 may be performed within control circuit 145.

As shown in FIG. 3, method 300 begins by receiving various information in a control circuit of the compression circuit. More specifically, at block 310 the control circuit may receive traffic level information, e.g., in the form of a distress signal and buffer depth information regarding a measure of how many data packets are present in the egress queue associated with each of the traffic classes. Next at diamond 320, a compression determination is made. More specifically, this compression determination may be based at least in part on the traffic level information, the buffer depth information and priority of the given traffic class. For example, if the traffic class is of a lower priority and a distress signal indicates a high level of traffic on the interconnect, the control circuit may cause traffic of this traffic class to be compressed. In addition or as another determination, the decision to compress may further be based on the buffer depth information that identifies that the egress queue associated with this traffic class is relatively full, e.g., higher than a threshold level. In this situation, the control circuit may choose to compress data of the traffic class to enable a reduction in buffer depth, since at least some of the data packets will be compressed into a smaller form.

Still referring to FIG. 3, if it is determined to compress data of the traffic class, control passes to block 330, where the control circuit may send a compression enable signal to a first selection circuit of the pipeline to cause it to direct data of the incoming traffic class to the compression engine pipeline.

Understand that based on further information received during dynamic operation of the compression circuit, it may be determined that the factors that caused the compression decision to be made may have become alleviated, e.g., due to lower interconnect loading, less busyness of the traffic class or so forth. As such, during continued operations, the same information discussed above may be received in the control circuit (block 340). And a determination may be made based upon this information at diamond 350 as to whether to disable the compression. For example, compression may be disabled for a given traffic class when, e.g., traffic level information and/or the buffer depth information falls below corresponding thresholds (which may programmable, in some embodiments). If it is determined to disable compression, control passes to block 360 where compression is disabled after the compression engine has been drained of its pending data packets. For example, a stall signal may be asserted to stall incoming traffic from agents, until the compression agent is drained. In other cases, selective agents and/or selective classes may be allowed to proceed while stalling only the class that is being drained. Although shown at this high level in the embodiment of FIG. 3, many variations and alternatives are possible.

Figure 4:
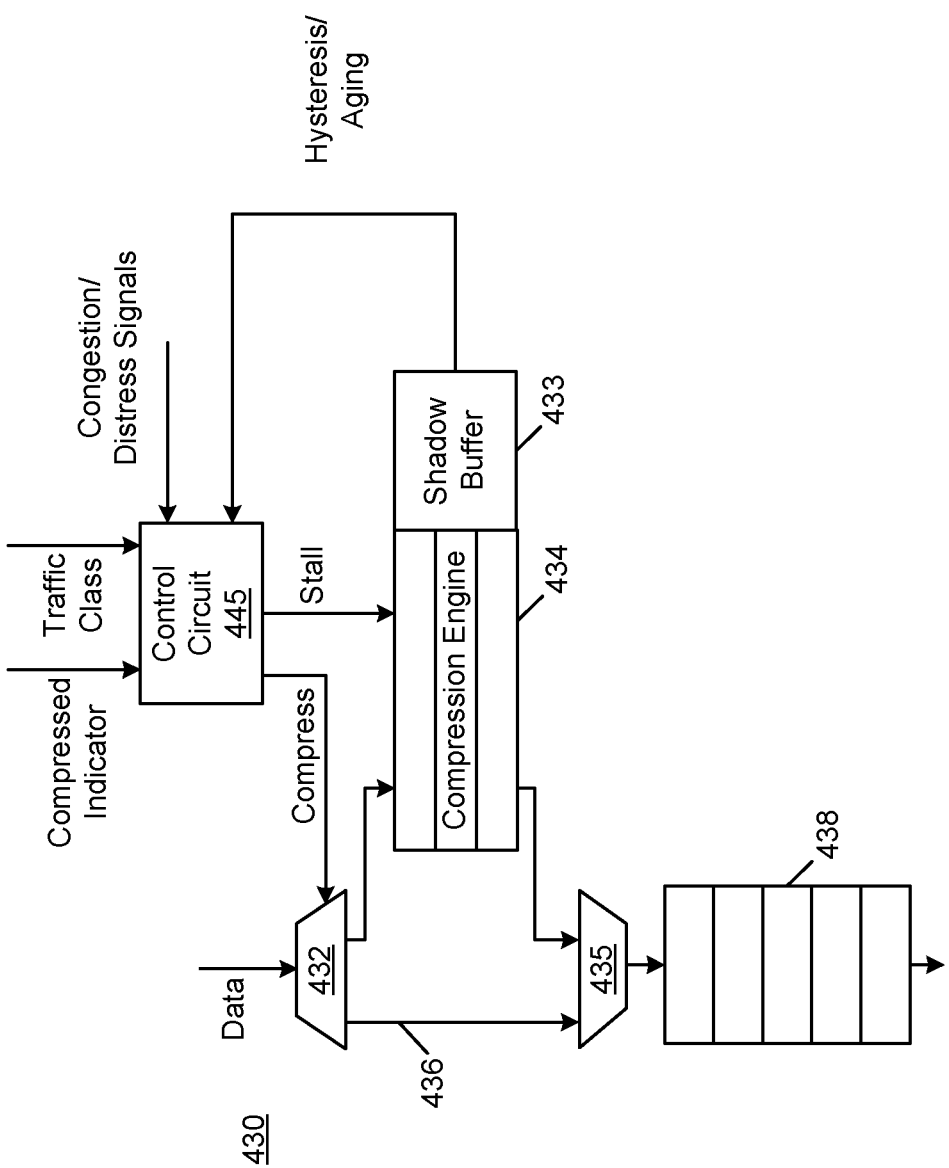
FIG. 4 is a block diagram of a compression circuit in accordance with another embodiment of the present invention.

Note that in some implementations, the cost, e.g., in terms of buffer space in the pipelines, real estate space, power consumption and so forth, of multiple pipelines may not be suitable. As such, in other implementations a compression circuit may be provided that has a unitary structure with a single pipeline which may independently and dynamically compress (or not) incoming data packets of different traffic classes. Referring now to FIG. 4, shown is a block diagram of a compression circuit in accordance with another embodiment of the present invention.

Note that in FIG. 4, a pipeline 430 of a compression circuit 400 may be adapted substantially similarly to pipelines 130 of FIG. 1. However, this single pipeline 430 is configured to handle incoming data packets of all available traffic classes. In general, pipeline 430 may be configured as a given one of pipelines 130 of FIG. 1. Thus as illustrated, pipeline 430 includes selection circuits 432 and 435, compression engine 434, bypass path 436, and egress queue 438, all under control of control circuit 445.

Note that in an embodiment, there may be an additional shadow buffer 433 to be used as described herein. Also, additional control and status signals may be communicated within compression circuit 400 to enable appropriate control to ensure that traffic ordering rules and so forth are met. With a single pipeline as in FIG. 4, the following capabilities are provided, including: ability to bypass compression engine 434, in that compression can be disabled; maintain packet order within a traffic class; independent compression enable control for each traffic class; and ensuring liveness such that all traffic eventually makes progress.

As further illustrated in FIG. 4, control circuit 445 also may receive a compression indicator with incoming data packets. This compressed signal, which may be in the form of a compression bit or other compression indicator, indicates that an associated data packet has already been compressed. For example, it is possible that the source agent in many instances simply passes along as a routing block incoming packets it receives from other agents. Some of these packets may be compressed already. When an incoming packet is already compressed, as determined based on this compressed indicator and due to ordering requirements, control circuit 445 may cause first selection circuit 432 to direct the already compressed data packets to a shadow buffer 433. In this way, if the traffic class has compression enabled, already compressed data traverses through shadow buffer 433 (e.g., a FIFO) which may be configured to have an equal depth to compression engine 434 so as to maintain ordering.

In addition, to ensure that all traffic classes, even low priority traffic classes, make forward progress and do not remain stalled within compression engine 434, information including hysteresis information and aging information may be provided from compression engine 434 to control circuit 445, along with a traffic class indicator. This traffic class indicator may be sent at a high level, e.g., 0 (low) or 1 (high), to indicate the priority of the data. High priority traffic may be allowed to bypass low priority traffic, for example, if low priority traffic is being compressed while high priority traffic is not. Control circuit 445 also receives congestion/distress signals, which may be any form of indicators from a system regarding the level of congestion.

Control circuit 445 may thus determine based at least in part on this information that a given traffic class is prevented from forward progress due to higher priority traffic, e.g., being sent to bypass path 436. In this situation, control circuit 445 may cause such higher priority traffic also to be directed for compression operations in compression engine 434 such that all traffic classes may make forward progress, by routing through second selection circuit 435 to egress buffer 438.

The hysteresis/aging signals provide feedback from egress buffer 438. Specifically, the hysteresis information may provide information as to a number of entries in compression engine 434 for each priority class. Using this information, compression enable for a given priority is not disabled until compression engine 434 is drained of all data of that priority. If compression were to be disabled with traffic in compression engine 434, then later arriving traffic could bypass compressed traffic, violating the ordering requirement. Aging information may be used to indicate age of traffic in the compression engine 434. In the case where low priority traffic compression is enabled and high priority traffic compression is disabled, low priority traffic may build up in compression engine 434 and/or egress queue 438, while high priority traffic continually bypasses it and consumes all of the fabric bandwidth. In this case low priority traffic may stall indefinitely, eventually impacting performance.

In an embodiment, the aging signal indicates to control circuit 445 an age of the data in compression engine 434. When it passes a programmable threshold, compression is enabled for high priority traffic. In this way, all traffic is set to compression engine 434, ensuring that low priority traffic makes progress. In an embodiment, the stall signal causes a stall of compression engine 445 if traffic is using bypass path 436. It is assumed in this embodiment that egress queue 438 can accept only one data word per cycle.

Figure 5:
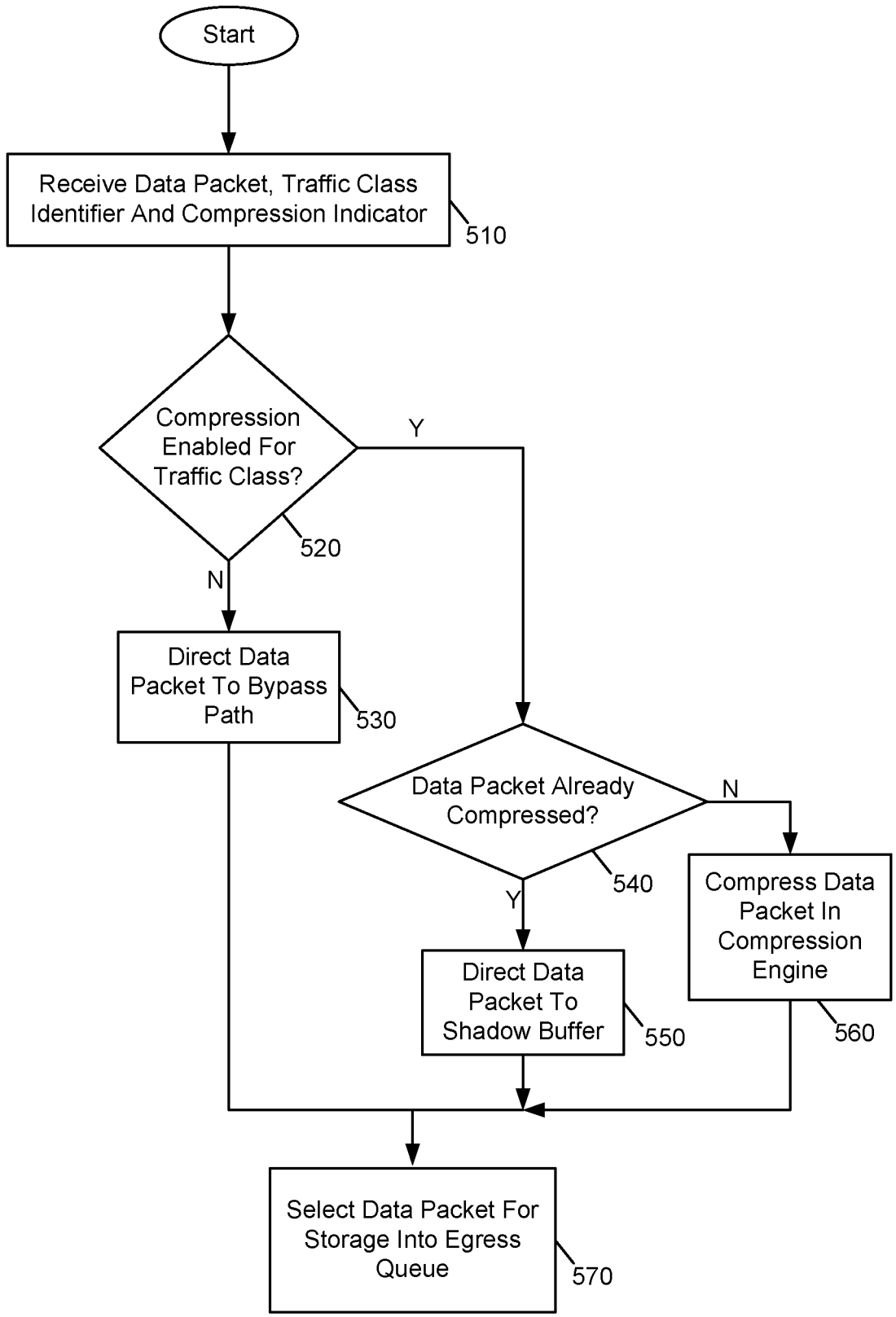
FIG. 5 is a flow diagram of a method in accordance with another embodiment of the present invention.

Referring now to FIG. 5, shown is a flow diagram of a method in accordance with another embodiment of the present invention. More specifically, method 500 is a method for operating a compression circuit having a single pipeline such as present in FIG. 4. As such, method 500 may be performed by hardware circuitry, firmware, software and/or combinations thereof. In a particular embodiment, method 500 may be performed within compression circuit 400.

As seen, method 500 begins by receiving a data packet, a traffic class identifier and a compression indicator (block 510). As discussed above, all this information may be received in a compression circuit, and a control circuit may, based at least in part on the compression indicator and traffic class information, determine whether the traffic class is enabled for compression (diamond 520). If not, the control circuit may cause a first selection circuit to direct this data packet to the bypass path, e.g., directly to a second selection circuit (block 530).

Instead if it is determined that compression is enabled for the traffic class, next it may be determined whether the data packet is already compressed (diamond 540). As discussed above, this determination may be based on a compression indicator associated with the data packet. If the data packet was previously compressed, control passes to block 550 where the data packet is directed to a shadow buffer. Otherwise if the data packet was not previously compressed, at block 560 the data packet may be compressed in the compression engine.

Still with reference to FIG. 5, from all of blocks 530, 550 and 560, control passes to block 570 where a given data packet can be selected for storage into the egress queue. In an embodiment, various considerations may inform this selection decision, as discussed above. Understand while shown at this high level in the embodiment of FIG. 5, variations and alternatives are possible.

Figure 6:
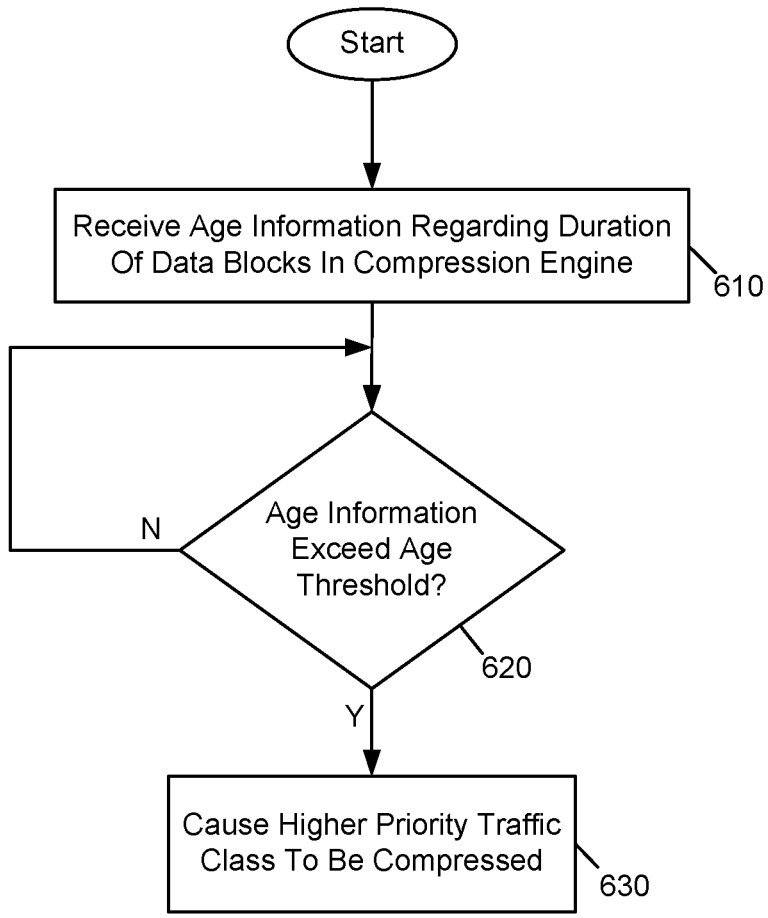
FIG. 6 is a flow diagram of a method in accordance with yet another embodiment of the present invention.

As discussed above, with an arrangement as in FIG. 4, it may be possible for a high priority traffic class that is routed by way of a bypass path to cause starvation of data packets of one or more lower priority traffic classes. As such, embodiments may provide control techniques to ensure that all traffic classes are fairly allocated bandwidth. Referring now to FIG. 6, shown is a flow diagram of a method in accordance with yet another embodiment of the present invention. More specifically, method 600 is a method for controlling a compression circuit having a single pipeline such as present in FIG. 4. As such, method 600 may be performed by hardware circuitry, firmware, software and/or combinations thereof. In a particular embodiment, method 600 may be performed within control circuit 445.

As shown in FIG. 6, method 600 may be used to control compression decisions to ensure that all traffic classes make forward progress. As seen, method 600 begins by receiving age information regarding a duration of data blocks in the compression engine (block 610). More specifically, the control circuit may receive this age information which may include, as an example, a number of data packets of each of the traffic classes that are present in the compression engine. In addition, the age information may further identify a relative age of each of these packets for each the traffic classes. Then it can be determined at diamond 620 whether the oldest packet of one or more of the traffic classes exceeds a corresponding age threshold for the traffic class. If not, no additional control techniques are needed and operation may continue back at block 610.

Instead if it is determined that at least one traffic class has data packets that have been present in the compression engine for longer than the age threshold, control passes to block 630, where a higher priority traffic class is caused to be compressed. By way of this operation, no additional data packets of this high priority traffic class will flow through the bypass path. As such, compressed data packets of the lower priority present in a compression engine may flow through to the egress queue, thus making forward progress. Understand while shown at this high level in the embodiment of FIG. 6, many variations and alternatives are possible.

Figure 7:
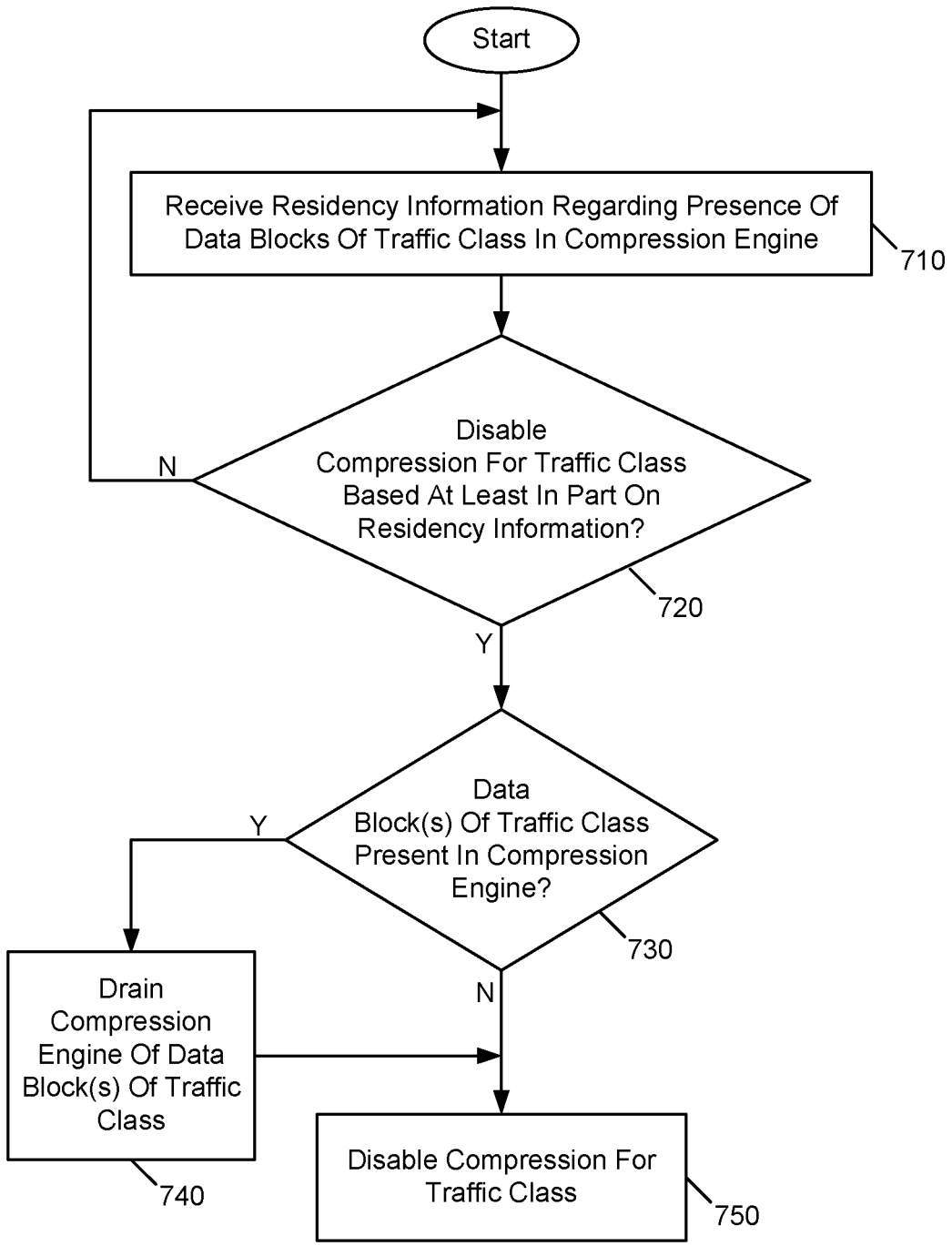
FIG. 7 is a flow diagram of a method in accordance with a still further embodiment of the present invention.

Referring now to FIG. 7, shown is a flow diagram of a method in accordance with a still further embodiment of the present invention. As shown in FIG. 7, method 700 is a method for dynamically disabling compression. In embodiments, method 700 may be performed by a control circuit of a compression circuit. As such, method 700 may be performed by hardware circuitry, firmware, software and/or combinations thereof.

As illustrated, method 700 begins by receiving residency information regarding presence of data blocks of a given traffic class in the compression engine (block 710). Such information may be received via feedback information, provided either by a compression engine or an egress buffer (or both), which provides an indication of an amount of data blocks of the given traffic class located within the compression circuit. Next it may be determined at diamond 720, based at least in part on this residency information, whether to disable compression for this traffic class. For example, the residency information may indicate a number of data blocks of the given traffic class, which may be compared to a threshold. This residency threshold may correspond to a given number of data blocks, and may be a programmable value, which may be different for each traffic class. Thus this determination at diamond 720 may be based on comparison of the residency information to this residency threshold. If no compression disabling is determined, no further operations occur, and control passes back to block 710 for evaluation of another traffic class or another evaluation interval.

Instead if it is determined to disable compression for the given traffic class, control next passes to diamond 730, where it may be determined if there are data blocks of this traffic class present in the compression engine itself. If so, control passes to block 740 where the compression engine may be drained of data blocks of this traffic class. Control then proceeds to block 750 where, after draining any data blocks present in the compression engine, compression for this traffic class may be disabled. As such, when incoming data packets of this traffic class are received, they may be passed directly, via a bypass path, and through a selection circuit to the egress queue. Understand while shown at this high level in the embodiment of FIG. 7, many variations and alternatives are possible.

Embodiments provide hardware compression techniques for interconnect structures that are efficient, and provide good performance across a wide range of workloads. Embodiments add minimal latency to read/write paths, while providing increased effective bandwidth proportional to the compression ratio achieved. The compression architecture of embodiments may be used in connection with different types of agents and data classes/flows. Although the scope of the present invention is not limited in this regard, some workloads may see traffic reductions of up to 3× using priority-based compression techniques as described herein.

Figure 8:
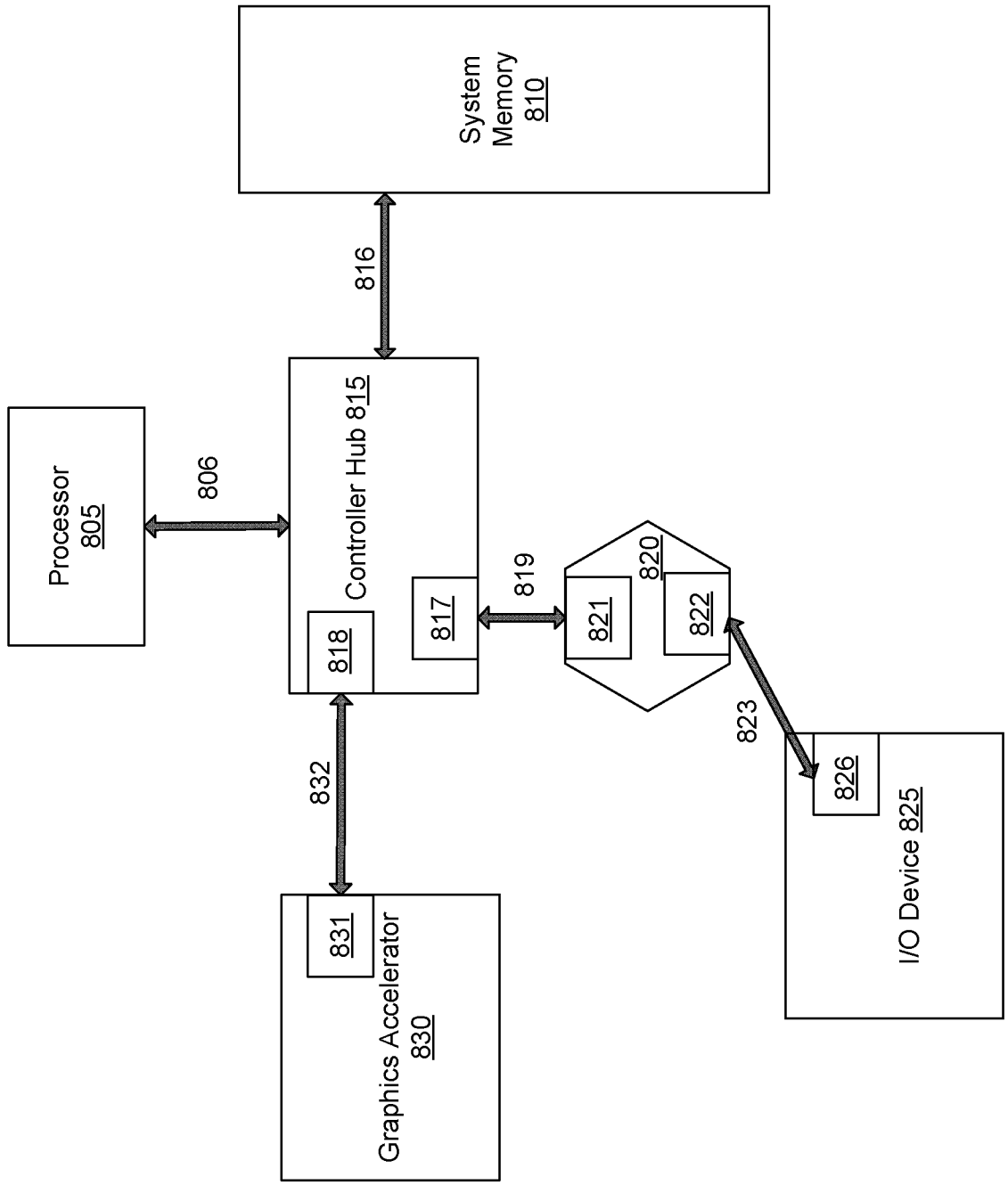
FIG. 8 is an embodiment of a fabric composed of point-to-point links that interconnect a set of components.

Embodiments may be implemented in a wide variety of interconnect structures. Referring to FIG. 8, an embodiment of a fabric composed of point-to-point links that interconnect a set of components is illustrated. System 800 includes processor 805 and system memory 810 coupled to controller hub 815. Processor 805 includes any processing element, such as a microprocessor, a host processor, an embedded processor, a co-processor, or other processor. Processor 805 is coupled to controller hub 815 through front-side bus (FSB) 806. In one embodiment, FSB 806 is a serial point-to-point interconnect. In an embodiment, processor 805 (and/or other components of system 800) may be implemented with one or more integrated circuits that include compression and decompression shim circuitry to perform compression/decompression operations dynamically and independently for different traffic and/or priority classes, as described herein.

System memory 810 includes any memory device, such as random access memory (RAM), non-volatile (NV) memory, or other memory accessible by devices in system 800. System memory 810 is coupled to controller hub 815 through memory interface 816. Examples of a memory interface include a double-data rate (DDR) memory interface, a dual-channel DDR memory interface, and a dynamic RAM (DRAM) memory interface.

In one embodiment, controller hub 815 is a root hub, root complex, or root controller in a PCIe interconnection hierarchy. Examples of controller hub 815 include a chip set, a memory controller hub (MCH), a northbridge, an interconnect controller hub (ICH), a southbridge, and a root controller/hub. Often the term chip set refers to two physically separate controller hubs, i.e. a memory controller hub (MCH) coupled to an interconnect controller hub (ICH). Note that current systems often include the MCH integrated with processor 805, while controller 815 is to communicate with I/O devices, in a similar manner as described below. In some embodiments, peer-to-peer routing is optionally supported through root complex 815.

Here, controller hub 815 is coupled to switch/bridge 820 through serial link 819. Input/output modules 817 and 821, which may also be referred to as interfaces/ports 817 and 821, include/implement a layered protocol stack to provide communication between controller hub 815 and switch 820. In one embodiment, multiple devices are capable of being coupled to switch 820.

Switch/bridge 820 routes packets/messages from device 825 upstream, i.e., up a hierarchy towards a root complex, to controller hub 815 and downstream, i.e., down a hierarchy away from a root controller, from processor 805 or system memory 810 to device 825. Switch 820, in one embodiment, is referred to as a logical assembly of multiple virtual PCI-to-PCI bridge devices. Device 825 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices and which may be coupled via an I3C bus, as an example. Often in the PCIe vernacular, such a device is referred to as an endpoint. Although not specifically shown, device 825 may include a PCIe to PCI/PCI-X bridge to support legacy or other version PCI devices. Endpoint devices in PCIe are often classified as legacy, PCIe, or root complex integrated endpoints.

Graphics accelerator 830 is also coupled to controller hub 815 through serial link 832. In one embodiment, graphics accelerator 830 is coupled to an MCH, which is coupled to an ICH. Switch 820, and accordingly I/O device 825, is then coupled to the ICH. I/O modules 831 and 818 are also to implement a layered protocol stack to communicate between graphics accelerator 830 and controller hub 815. A graphics controller or the graphics accelerator 830 itself may be integrated in processor 805.

Figure 9:
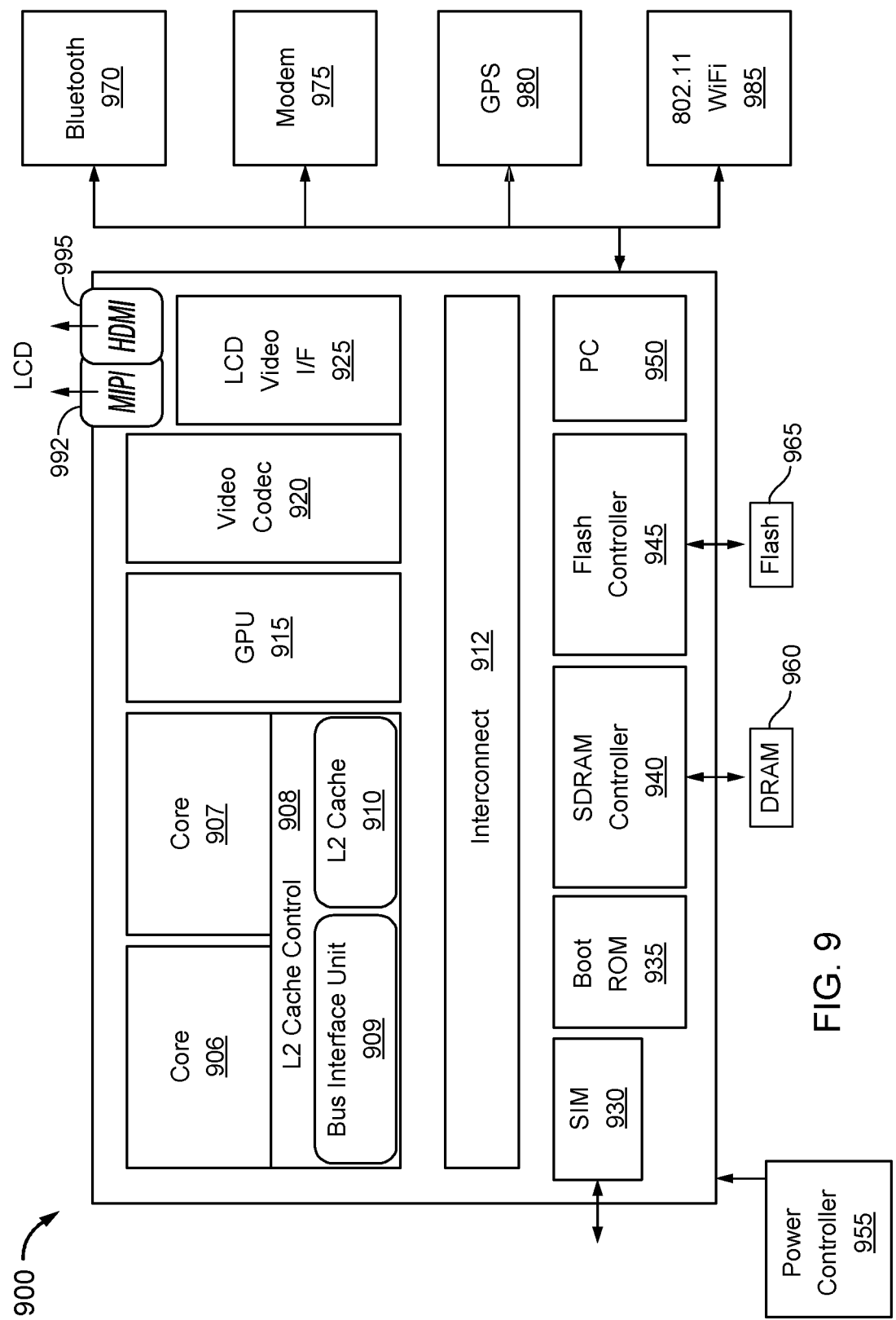
FIG. 9 is an embodiment of a system-on-chip design in accordance with an embodiment.

Turning next to FIG. 9, an embodiment of a SoC design in accordance with an embodiment is depicted. As a specific illustrative example, SoC 900 may be configured for insertion in any type of computing device, ranging from portable device to server system. Here, SoC 900 includes 2 cores 906 and 907. Cores 906 and 907 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 906 and 907 are coupled to cache control 908 that is associated with bus interface unit 909 and L2 cache 910 to communicate with other parts of system 900 via an interconnect 912, which may be implemented as an on-chip fabric. In an embodiment, interconnect 912 may be implemented as a mesh interconnect. In embodiments herein, shim circuitry as described herein may be adapted between the various components and interconnect 912.

Interconnect 912 provides communication channels to the other components, such as a Subscriber Identity Module (SIM) 930 to interface with a SIM card, a boot ROM 935 to hold boot code for execution by cores 906 and 907 to initialize and boot SoC 900, a SDRAM controller 940 to interface with external memory (e.g., DRAM 960), a flash controller 945 to interface with non-volatile memory (e.g., flash 965), a peripheral controller 950 (e.g., an eSPI interface) to interface with peripherals, video codec 920 and video interface 925 to display and receive input (e.g., touch enabled input), GPU 915 to perform graphics related computations, etc. In addition, the system illustrates peripherals for communication, such as a Bluetooth module 970, 3G modem 975, GPS 980, and WiFi 985. Also included in the system is a power controller 955. Further illustrated in FIG. 9, system 900 may additional include interfaces including a MIPI interface 992, e.g., to a display and/or an HDMI interface 995 also which may couple to the same or a different display.

Figure 10:
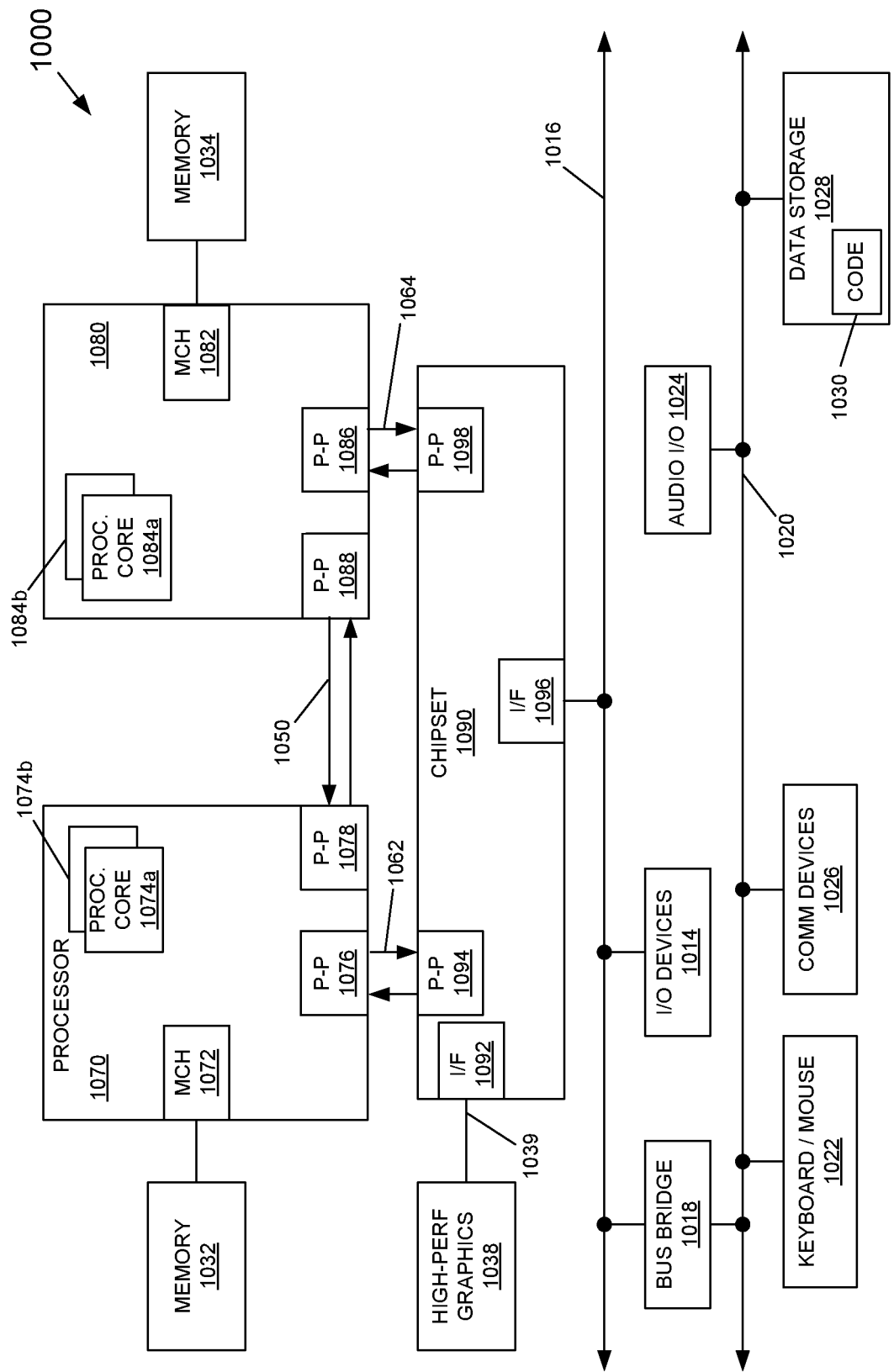
FIG. 10 is a block diagram of a system in accordance with an embodiment of the present invention.

Referring now to FIG. 10, shown is a block diagram of a system in accordance with an embodiment of the present invention. As shown in FIG. 10, multiprocessor system 1000 includes a first processor 1070 and a second processor 1080 coupled via a point-to-point interconnect 1050. As shown in FIG. 10, each of processors 1070 and 1080 may be many core processors including representative first and second processor cores (i.e., processor cores 1074a and 1074b and processor cores 1084a and 1084b). In an embodiment, processors 1070 and 1080 each may be configured on single semiconductor die including a mesh interconnect and may include compression and decompression shim circuitry to perform compression/decompression operations dynamically and independently for different traffic and/or priority classes, as described herein.

Still referring to FIG. 10, first processor 1070 further includes a memory controller hub (MCH) 1072 and point-to-point (P-P) interfaces 1076 and 1078. Similarly, second processor 1080 includes a MCH 1082 and P-P interfaces 1086 and 1088. As shown in FIG. 10, MCH's 1072 and 1082 couple the processors to respective memories, namely a memory 1032 and a memory 1034, which may be portions of system memory (e.g., DRAM) locally attached to the respective processors. First processor 1070 and second processor 1080 may be coupled to a chipset 1090 via P-P interconnects 1062 and 1064, respectively. As shown in FIG. 10, chipset 1090 includes P-P interfaces 1094 and 1098.

Furthermore, chipset 1090 includes an interface 1092 to couple chipset 1090 with a high performance graphics engine 1038, by a P-P interconnect 1039. As shown in FIG. 10, various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a disk drive or other mass storage device which may include code 1030, in one embodiment. Further, an audio I/O 1024 may be coupled to second bus 1020.

The following examples pertain to further embodiments.

In one example, an apparatus includes: a compression circuit to compress data blocks of one or more traffic classes; and a control circuit coupled to the compression circuit, where the control circuit is to enable the compression circuit to concurrently compress data blocks of a first traffic class and not to compress data blocks of a second traffic class.

In an example, the compression circuit comprises: a first selection circuit to receive a data block of a traffic class and direct the data block to a compression engine or a bypass path; the compression engine coupled to the first selection circuit to compress the data block; a second selection circuit coupled to receive compressed data blocks from the compression engine and data blocks from the bypass path and output a selected one of the compressed data blocks and the data blocks; and an egress queue to store the compressed data blocks and the data blocks.

In an example, the compression circuit comprises a plurality of pipeline circuits each comprising the first selection circuit, the compression engine, the second selection circuit and the egress queue, where each of the plurality of pipeline circuits is associated with a traffic class.

In an example, the apparatus further comprises an arbiter coupled to the egress queue of the plurality of pipeline circuits, where the arbiter is to arbitrate between the compressed data blocks and the data blocks from the plurality of pipeline circuits.

In an example, the control circuit is to stall the compression engine when the data blocks of the first traffic class are sent to the egress queue via the bypass path.

In an example, the apparatus further comprises a shadow buffer coupled to the compression engine to store data blocks compressed in an agent coupled to the compression circuit.

In an example, the control circuit is to control the compression circuit to concurrently compress the data blocks of the first traffic class and not compress the data blocks of the second traffic class based at least in part on a bandwidth of an interconnect, where the second traffic class has a higher priority than the first traffic class.

In an example, the control circuit is to control the compression circuit to concurrently compress the data blocks of the first traffic class and compress the data blocks of the second traffic class based at least in part on the bandwidth of the interconnect exceeding at least one threshold.

In an example, the compression circuit is to disable compression of the data blocks of the first traffic class in response to an indication that the compression engine is drained of compressed data blocks of the first traffic class.

In an example, the control circuit is to control the compression circuit to compress the data blocks of the second traffic class based at least in part on an age of compressed data blocks of the first traffic class in the compression circuit.

In an example, the apparatus comprises a compression shim circuit coupled between an agent and a fabric.

In another example, a method comprises receiving a first data packet and a first traffic class identifier in a compression circuit coupled to an agent of an integrated circuit; based at least in part on the first traffic class identifier, directing the first data packet to a first pipeline of the compression circuit, compressing the first data packet in the first pipeline and sending the compressed first data packet to a first egress queue of the compression circuit; receiving a second data packet and a second traffic class identifier in the compression circuit; based at least in part on the second traffic class identifier, directing the second data packet to a second pipeline of the compression circuit, bypassing compressing of the second data packet in the second pipeline and sending the second data packet to a second egress queue of the compression circuit; and selecting one of the compressed first data packet and the second data packet for output to an interconnect coupled to the compression circuit.

In an example, the method further comprises: determining to compress the first data packet based at least in part on the first traffic class identifier; and determining to not compress the second data packet based at least in part on the second traffic class identifier, where the second traffic class identifier identifies a second traffic class having a higher priority than a first traffic class identified by the first traffic class identifier.

In an example, the method further comprises compressing the second data packet in the second pipeline when a traffic measure regarding traffic on the interconnect exceeds a threshold.

In an example, the method further comprises dynamically disabling compression of data packets of the first traffic class based on at least one of traffic information regarding the interconnect and buffer depth information regarding the first egress queue.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In another example, a system comprises: a first agent to output first data packets of a first traffic class and second data packets of a second traffic class; a compression circuit coupled to the first agent; and a fabric coupled to the compression circuit, where the fabric is to couple the first agent to a plurality of agents. In an example, the compression circuit comprises: a first pipeline having a first compression engine to compress the first data packets of the first traffic class and a first egress queue to store at least the compressed first data packets of the first traffic class; a second pipeline having a second compression engine, when enabled, to compress the second data packets of the second traffic class and a bypass path to cause the second data packets of the second traffic class to bypass the second compression engine when the second compression engine is not enabled, and a second egress queue to store at least one of the second data packets of the second traffic class and the compressed second data packets of the second traffic class; and a control circuit to dynamically enable and disable at least the second compression engine based at least in part on traffic conditions of the fabric.

In an example, the control circuit is to stall the second compression engine when the second data packets of the second traffic class are communicated via a bypass path of the second pipeline.

In an example, the control circuit is to control the first compression engine to compress the first data packets of the first traffic class and to disable the second compression engine, to prevent compression of the second data packets of the second traffic class based at least in part on the traffic conditions of the fabric, where the second traffic class has a higher priority than the first traffic class.

In an example, the control circuit is to control the second compression engine to compress the second data packets of the second traffic class based at least in part on a bandwidth of the fabric exceeding at least one threshold.

In an example, the system comprises a system on chip, the plurality of agents comprises a plurality of cores, the fabric comprises an on-chip fabric, and the compression circuit comprises a shim circuit coupled between the agent and the fabric.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a compression circuit comprising:
        a first pipeline including a first compression engine to compress first data blocks associated with a first priority; and
        a second pipeline including a second compression engine, when enabled, to compress second data blocks associated with a second priority, and a bypass path to cause the second data blocks to bypass the second compression engine when the second compression engine is not enabled; and a control circuit coupled to the compression circuit, wherein the control circuit is to enable the compression circuit to concurrently compress the first data blocks associated with the first priority based at least in part on the first priority in the first pipeline and to bypass compression of the second data blocks associated with the second priority based at least in part on the second priority in the second pipeline.

2. The apparatus of claim 1, wherein the compression circuit comprises:
a first selection circuit to receive the second data blocks associated with the second priority and direct the second data blocks to the second compression engine or the bypass path, the second compression engine coupled to the first selection circuit;
a second selection circuit coupled to receive compressed second data blocks from the second compression engine and the second data blocks from the bypass path and output a selected one of the compressed second data blocks and the second data blocks; and
an egress queue to store the compressed second data blocks and the second data blocks.

3. The apparatus of claim 2, wherein the compression circuit comprises a plurality of pipeline circuits including the first and second pipeline circuits, each pipeline circuit comprising the first selection circuit, an associated compression engine, the second selection circuit and the egress queue, wherein each of the plurality of pipeline circuits is associated with a priority.

4. The apparatus of claim 3, further comprising an arbiter coupled to the egress queue of the plurality of pipeline circuits, wherein the arbiter is to arbitrate between the compressed data blocks and the data blocks from the plurality of pipeline circuits.

5. The apparatus of claim 2, wherein the control circuit is to stall the second compression engine when the second data blocks having the second priority are sent to the egress queue via the bypass path.

6. The apparatus of claim 2, further comprising a shadow buffer coupled to the second compression engine to store the second data blocks compressed in an agent coupled to the compression circuit.

7. The apparatus of claim 1, wherein the control circuit is to control the compression circuit to concurrently compress the first data blocks having the first priority and not compress the second data blocks having the second priority based at least in part on a bandwidth of an interconnect, wherein the second priority is higher than the first priority.

8. The apparatus of claim 7, wherein the control circuit is to control the compression circuit to concurrently compress the first data blocks of the first priority and compress the second data blocks of the second priority based at least in part on the bandwidth of the interconnect exceeding at least one threshold.

9. The apparatus of claim 1, wherein the compression circuit is to disable compression of the second data blocks of the second priority in response to an indication that the second compression engine is drained of compressed second data blocks of the second priority.

10. The apparatus of claim 1, wherein the control circuit is to control the compression circuit to compress the second data blocks of the second priority based at least in part on an age of compressed first data blocks of the first priority in the compression circuit.

11. The apparatus of claim 1, wherein the apparatus comprises a compression shim circuit coupled between an agent and a fabric.

12. A non-transitory machine-readable medium having stored thereon instructions, which if performed by a machine cause the machine to perform a method comprising:
receiving a first data packet and a first traffic class identifier in a compression circuit coupled to an agent of an integrated circuit;
based at least in part on the first traffic class identifier, directing the first data packet to a first pipeline of the compression circuit, compressing the first data packet in the first pipeline and sending the compressed first data packet to a first egress queue of the compression circuit;
receiving a second data packet and a second traffic class identifier in the compression circuit;
based at least in part on the second traffic class identifier, directing the second data packet to a second pipeline of the compression circuit, bypassing compressing of the second data packet in the second pipeline and sending the second data packet to a second egress queue of the compression circuit; and
selecting one of the compressed first data packet and the second data packet for output to an interconnect coupled to the compression circuit.

13. The non-transitory machine-readable medium of claim 12, wherein the method further comprises:
determining to compress the first data packet based at least in part on the first traffic class identifier; and
determining to not compress the second data packet based at least in part on the second traffic class identifier, wherein the second traffic class identifier identifies a second traffic class having a higher priority than a first traffic class identified by the first traffic class identifier.

14. The non-transitory machine-readable medium of claim 12, wherein the method further comprises compressing the second data packet in the second pipeline when a traffic measure regarding traffic on the interconnect exceeds a threshold.

15. The non-transitory machine-readable medium of claim 12, wherein the method further comprises dynamically disabling compression of data packets of the first traffic class based on at least one of traffic information regarding the interconnect and buffer depth information regarding the first egress queue.

16. A system comprising:
a first agent to output first data packets of a first traffic class and second data packets of a second traffic class;
a compression circuit coupled to the first agent, the compression circuit comprising:
a first pipeline having a first compression engine to compress the first data packets of the first traffic class and a first egress queue to store at least the compressed first data packets of the first traffic class;
a second pipeline having a second compression engine, when enabled, to compress the second data packets of the second traffic class and a bypass path to cause the second data packets of the second traffic class to bypass the second compression engine when the second compression engine is not enabled, and a second egress queue to store at least one of the second data packets of the second traffic class and the compressed second data packets of the second traffic class; and
a control circuit to dynamically enable and disable at least the second compression engine based at least in part on traffic conditions of a fabric; and the fabric coupled to the compression circuit, wherein the fabric is to couple the first agent to a plurality of agents.

17. The system of claim 16, wherein the control circuit is to stall the second compression engine when the second data packets of the second traffic class are communicated via the bypass path of the second pipeline.

18. The system of claim 16, wherein the control circuit is to control the first compression engine to compress the first data packets of the first traffic class and to disable the second compression engine, to prevent compression of the second data packets of the second traffic class based at least in part on the traffic conditions of the fabric, wherein the second traffic class has a higher priority than the first traffic class.

19. The system of claim 18, wherein the control circuit is to control the second compression engine to compress the second data packets of the second traffic class based at least in part on a bandwidth of the fabric exceeding at least one threshold.

20. The system of claim 16, wherein the system comprises a system on chip, the plurality of agents comprising a plurality of cores, the fabric comprising an on-chip fabric, and the compression circuit comprising a shim circuit coupled between the first agent and the fabric.

\* \* \* \* \*